(12) United States Patent
Rivers et al.

(10) Patent No.: US 9,030,906 B2
(45) Date of Patent: May 12, 2015

(54) ISOLATING, AT LEAST IN PART, LOCAL ROW OR COLUMN CIRCUITRY OF MEMORY CELL BEFORE ESTABLISHING VOLTAGE DIFFERENTIAL TO PERMIT READING OF CELL

(75) Inventors: Doyle Rivers, El Dorado Hills, CA (US); Prashant S. Damle, Portland, OR (US); Raymond W. Zeng, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 13/995,230

(22) PCT Filed: Jun. 6, 2012

(86) PCT No.: PCT/US2012/041166
§ 371 (c)(1),
(2), (4) Date: Jun. 18, 2013

(87) PCT Pub. No.: WO2013/184111
PCT Pub. Date: Dec. 12, 2013

(65) Prior Publication Data
US 2014/0016406 A1  Jan. 16, 2014

(51) Int. Cl.
*G11C 8/00* (2006.01)
*G11C 13/00* (2006.01)
*G11C 7/02* (2006.01)

(52) U.S. Cl.
CPC .......... *G11C 13/0004* (2013.01); *G11C 13/004* (2013.01); *G11C 7/02* (2013.01)

(58) Field of Classification Search
USPC .......... 365/148, 158, 230.03, 230.06, 189.15
See application file for complete search history.

(56) References Cited

U.S. PATENT DOCUMENTS

| | | | |
|---|---|---|---|
| 6,754,107 B2 | 6/2004 | Khouri et al. | |
| 7,046,543 B2 * | 5/2006 | Arimoto et al. | 365/149 |
| 7,405,964 B2 | 7/2008 | Philipp et al. | |
| 2003/0128598 A1 * | 7/2003 | Lim et al. | 365/194 |
| 2009/0157993 A1 | 6/2009 | Garrett | |
| 2010/0027326 A1 * | 2/2010 | Kim et al. | 365/163 |
| 2011/0188305 A1 | 8/2011 | Yang | |

(Continued)

FOREIGN PATENT DOCUMENTS

| | | |
|---|---|---|
| JP | 4313372 B2 | 8/2009 |
| WO | 2013/184111 A1 | 12/2013 |

OTHER PUBLICATIONS

International Search Report and Written Opinion received for PCT Patent Application No. PCT/US2012/041166, mailed on Aug. 20, 2013, 10 pages.

(Continued)

*Primary Examiner* — Anthan Tran
(74) *Attorney, Agent, or Firm* — Christopher K. Gagne

(57) ABSTRACT

An embodiment may include local row and column circuitry that are local to a memory cell of a memory device. Either the local row circuitry or the local column circuitry may be electrically isolated, at least in part, from at least one remaining portion of the memory device during the establishing of a voltage differential between the local row circuitry and the local column circuitry that is to permit the memory cell to be read during a read of the memory cell. The read may occur subsequent to the establishing of the voltage differential. Many variations, modifications, and alternatives are possible without departing from this embodiment.

17 Claims, 4 Drawing Sheets

(56) References Cited

U.S. PATENT DOCUMENTS

2011/0292712 A1  12/2011  Perner
2012/0014173 A1   1/2012  Deng

OTHER PUBLICATIONS

Wikipedia, "Phase-change memory", Phase-change memory—Wikipedia, the free encyclopedia, Mar. 9, 2012, 11 pages. Retrived from: http://en.wikipedia.org/wiki/Phase-change_memory.

* cited by examiner

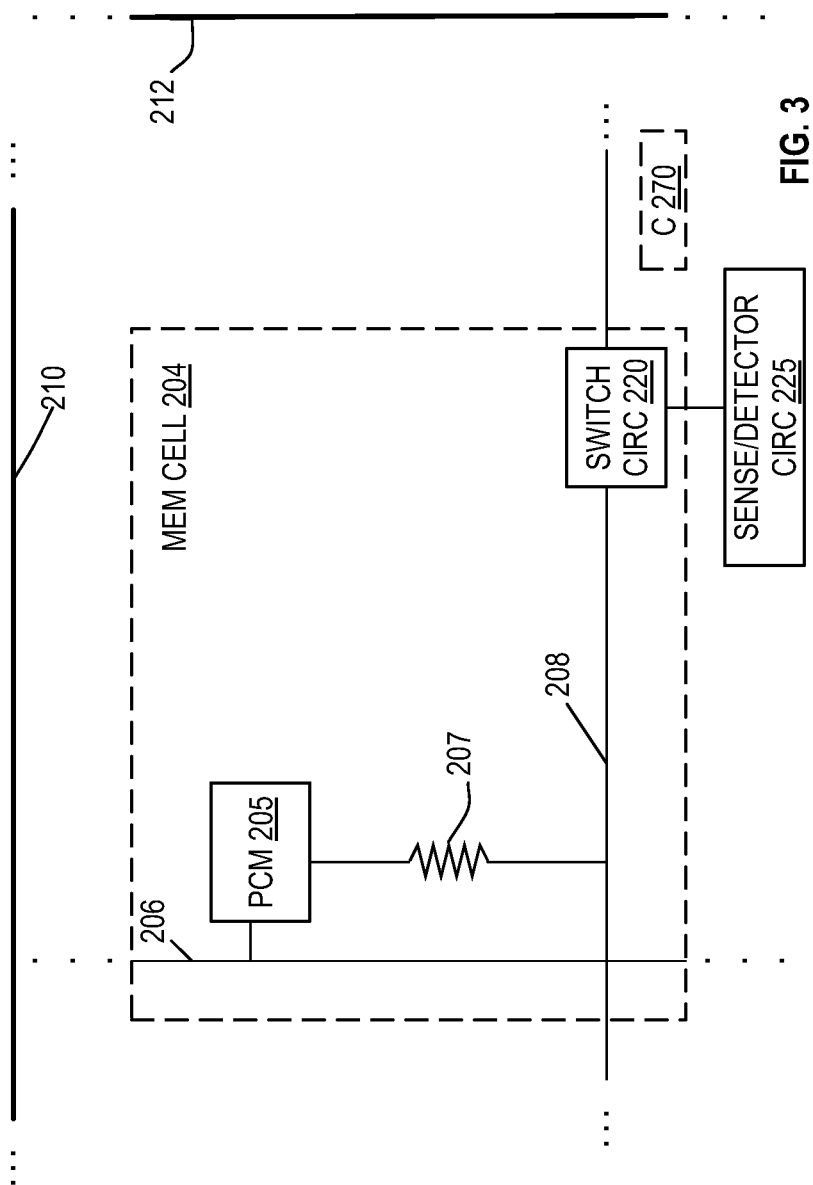

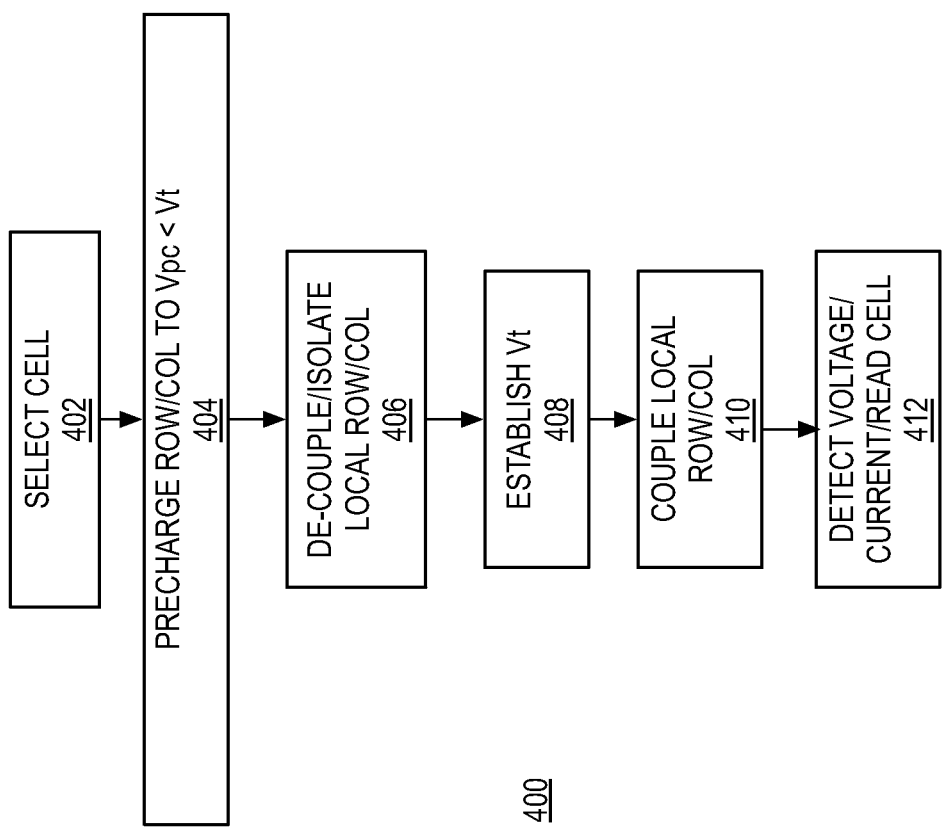

ISOLATING, AT LEAST IN PART, LOCAL ROW OR COLUMN CIRCUITRY OF MEMORY CELL BEFORE ESTABLISHING VOLTAGE DIFFERENTIAL TO PERMIT READING OF CELL

FIELD

This disclosure relates to isolating, at least in part, local row or column circuitry of a memory cell before establishing a voltage differential that is to permit reading of the cell.

BACKGROUND

In a cross-point memory architecture read operation, a voltage differential is applied between a row and a column of a memory cell in the memory. The logic state of the cell is then determined by measuring a bias voltage and determining whether the bias voltage exceeds a cell threshold voltage.

During this conventional read operation, it is possible that a relatively large capacitive discharge may occur through the memory that is capable of disturbing (e.g., corrupting) the logic state of the cell and/or significantly reducing the number of read operations that can be performed on the cell before the cell's data will need to be rewritten. As can be appreciated, this may significantly degrade the memory's performance and/or increase the complexity of the operations and/or circuitry involved in managing the memory.

BRIEF DESCRIPTION OF THE SEVERAL VIEWS OF THE DRAWINGS

Features and advantages of embodiments will become apparent as the following Detailed Description proceeds, and upon reference to the Drawings, wherein like numerals depict like parts, and in which:

FIG. 3 illustrates features in an embodiment.
FIG. 4 illustrates operations in an embodiment.

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
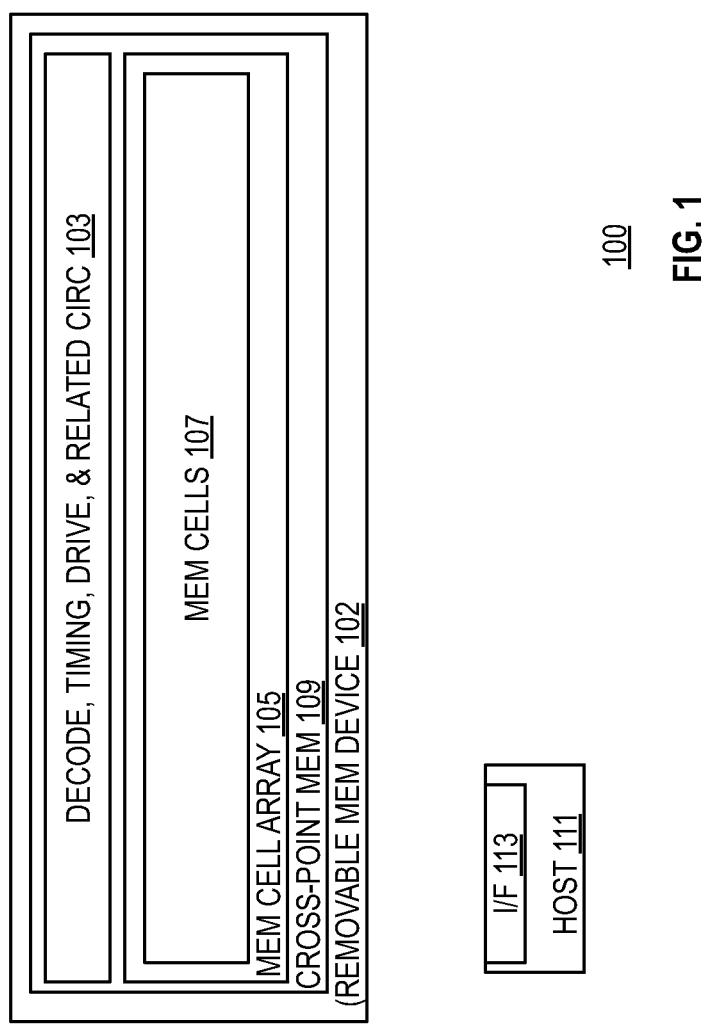
FIG. 1 illustrates a system embodiment.

FIG. 1 illustrates a system 100 that may comprise a memory device 102. In this embodiment, memory device 102 may be, comprise, or be comprised in a removable memory device that may be capable of being removably (e.g., electrically and/or mechanically) coupled, at least in part, to a host 111 via one or more interfaces 113 of the host 111. For example, in this embodiment, removable memory device 102 and/or interface 113 may be compatible with the Universal Serial Bus Specification Revision 2.0, published Apr. 27, 2000, copyright 2000, Compaq Computer Corporation, et al. and/or Universal Serial Bus 3.0 Specification, Revision 1.0, published Nov. 12, 2008, Hewlett-Packard Company et al. (hereinafter collectively and/or singly referred to as "USB protocol"). Thus, for example, removable memory device 102 may comprise one or more not shown USB protocol compatible interfaces that may capable of being electrically and mechanically (e.g., physically) mated with one or more interfaces 113. When so electrically and physically mated, removable memory device 102 (and/or other components thereof) may be capable of exchanging data and/or one or more commands with host 111 (and/or one or more components thereof), via one or more interfaces 113, in accordance with the USB protocol. Thus, in this embodiment, removable memory device 102, one or more interfaces 113, and/or host 111 may be or comprise USB protocol compatible devices.

Alternatively or additionally, without departing from this embodiment, removable memory device 102 may be or comprise a secure digital (SD) memory device, and/or one or more interfaces 113 may be capable of interfacing (e.g., electrically, mechanically, and/or wirelessly) such an SD memory device with host 111 so as to permit data and/or command exchange between host 111 and device 102 via one or more interfaces 113. For example, memory device 102 and/or one or more interfaces 113 may comply and/or be compatible with, at least in part, one or more SD memory specifications published by SD Association, San Ramon, Calif., such as, for example, Part I Physical Layer Simplified Specification Version 3.01, released May 18, 2010, and/or other, related, and/or additional such specifications.

Of course, the foregoing is merely exemplary, and many other alternatives, modifications, and/or variations are possible without departing from this embodiment. For example, without departing from this embodiment, memory device 102 may be or comprise one or more other types of removable memory devices. Additionally or alternatively, without departing from this embodiment, memory device 102 may not be or comprise a removable memory device, but instead, may comprise (or be comprised in) an integrated circuit memory device that is intended to be permanently coupled in and/or to host 111, such as, for example, a not shown system and/or motherboard memory of host 111 that is to be accessed and/or controlled, at least in part, by one or more (not shown) host processors and/or chipset integrated circuit chips. Additionally or alternatively, memory device 102 may be or comprise one or more other types of memory devices without departing from this embodiment.

In this embodiment, memory device 102 may comprise cross-point memory 109. In this embodiment, cross-point memory may comprise one or more memory cells that may be accessed based at least in part upon signals supplied via at least two conductive paths and/or terminals, such as, for example, row and column signals paths, and/or bit and word lines. In this embodiment, a memory or memory cell may be or comprise an entity that is capable of storing, at least temporarily, at least one datum. In this embodiment, an access may comprise reading and/or writing of at least one datum.

Memory 109 and/or memory device 102 may comprise one or more memory cell arrays 105 and/or circuitry 103. One or more arrays 105 may comprise one or more (and in this embodiment, a plurality of) memory cells 107. In this embodiment, circuitry 103 may be coupled to one or more arrays 105 and may be or comprise memory array and/or memory cell selection, decode, control, timing, drive, and/or related circuitry. Circuitry 103 may be capable of implementing and/or controlling, at least in part, read, write, and/or other operations that may be applied to and/or involve, at least in part, one or more arrays 105 and/or cells 107 so as to selectively data to be written to and/or read from the one or more arrays 105 and/or cells 107.

In this embodiment, the terms "host computer," "host," "server," "client," "network node," and "node" may be used interchangeably, and may mean, for example, without limitation, one or more end stations, mobile internet devices, smart phones, media devices, input output (I/O) devices, tablet computers, appliances, intermediate stations, network interfaces, clients, servers, and/or portions thereof. In this embodiment, data and information may be used interchangeably, and may be, comprise, encode, and/or be encoded as, at least in part, one or more Boolean and/or logical levels and/or states, such as, one or more bits. Without limitation, such data may comprise one or more commands (for example one or more program instructions), and/or one or more such commands may be or comprise data and/or information. Also in this embodiment, an instruction may include data and/or one or more commands.

In this embodiment, "circuitry" may comprise, for example, singly or in any combination, analog circuitry, digital circuitry, hardwired circuitry, programmable circuitry, co-processor circuitry, state machine circuitry, and/or memory that may comprise program instructions that may be executed by programmable circuitry. Also in this embodiment, a processor, host processor, central processing unit, processor core, core, and controller each may comprise respective circuitry capable of performing, at least in part, one or more arithmetic and/or logical operations, and/or of executing, at least in part, one or more instructions.

In this embodiment, each of the memory cells 107 may have an identical respective construction and/or operation. For example, each of the memory cells 107 may comprise respective structural phase-change material (PCM) that may be coupled between a respective pair of row and column signal paths. The respective PCM in a respective memory cell may store at least one datum for the respective memory cell according to and/or based at least in part upon its respective electrical resistivity. For example, in this embodiment, the respective PCM may be or comprise, at least in part, crystalline glass, chalcogenide, and/or other material that exhibits reversible, non-volatile structure phase change from relatively amorphous phase to relatively crystalline phase, in which its relatively crystalline phase may exhibit a relatively lower electrical resistance, and relatively amorphous phase may exhibit a relatively higher electrical resistance. At least one datum may be written to the respective PCM by supplying a voltage differential across and/or current to a resistor within the respective cell that is sufficient to heat the respective PCM to a level that induces an appropriate phase change. Thereafter, the thus written datum may be read from the respective PCM by supplying a relatively lower voltage differential and/or current (e.g., relative to that which resulted in the phase change) that is sufficient to permit the resistance characteristics of the respective PCM to be measured, without inducing a phase change in the PCM that results in changing of the previously written logic state of the respective PCM.

For example, with reference to FIG. 2, the respective construction and operation of a respective memory cell 204 that may be comprised in memory cells 107 will now be described. For purposes of clarity of illustration, certain of the control, selection, and/or related circuitry of cell 204 are not shown in FIG. 2, but should be understood to be present nonetheless. Memory cell 204 may comprise local (e.g., local to and/or directly comprised in the particular memory cell 204) row circuitry 206 and local column circuitry 208. Local column circuitry 208 may be coupled to global column and decode circuitry 212. Local row circuitry 206 may be coupled, via switch circuitry 220, to sense and/or detector circuitry 225 and/or global row and decode circuitry 210. In this embodiment, switch circuitry 220 may comprise transistor-based switches (not shown) that may be selectively controlled (e.g., by circuitry 103) to controllably couple or decouple, in accordance with the respective states of the switches, the local row circuitry 206 to the circuitry 225 and/or the circuitry 210. For example, depending at least in part upon the control signals supplied to the switch circuitry 220 from circuitry 103, the switches in switch circuitry 220 may be made to enter respective states that may result in local row circuitry 206 being electrically coupled to, or conversely, electrically isolated from, at least in part, either or both of the circuitry 225 and/or circuitry 210. In this embodiment, the global column circuitry 212 may be or comprise, for example, one or more portions (e.g., decode and/or other circuitry) of circuitry 103, array 105, and/or memory 109 that may be associated with and/or coupled to respective (not shown) local column circuitry in one or more memory cells other than cell 204. Analogously, the global row circuitry 210 may comprise, for example, one or more portions (e.g., decode and/or other circuitry) of circuitry 103, array 105, and/or memory 109 that may be associated with and/or coupled to respective (not shown) local row circuitry in one or more memory cells other than cell 204. For purposes of this example, the respective voltage driver circuitry that may be comprised in circuitry 103 that may drive, at least in part, the voltages of the local column circuitry 208 and/or local row circuitry 206 may not be considered as being comprised, at least in part, in global column circuitry 212 and/or global row circuitry 210. Of course, the foregoing are merely examples, and the particular respective circuitry that may be comprised in global row circuitry 210 and/or global column circuitry 208 may vary without departing from this embodiment.

Cell 204 may be a phase-change memory cell that may comprise respective PCM 205 that may be coupled to local column circuitry 208. PCM 205 also may be coupled, via resistive element 207, to local row circuitry 206. As discussed previously, resistive element 207 may be used to heat PCM 205 sufficiently to induce a phase change that writes at least one datum to PCM 205 and/or cell 204.

Alternatively, without departing from this embodiment, as shown in FIG. 3, if a sense operation is to be carried out via local column circuitry 208 instead of via local row circuitry 206, local row circuitry 206 may not be coupled via switch circuitry 225 to global row circuitry 210 and sense and detector circuitry 220. Instead, local column circuitry 208 may be coupled via switch circuitry 225 to global column circuitry 212 and sense and detector circuitry 225. In the alternative shown in FIG. 3, depending at least in part upon the control signals supplied to the switch circuitry 220 from circuitry 103, the switches in switch circuitry 220 may be made to enter respective states that may result in local column circuitry 206 being electrically coupled to, or conversely, electrically isolated from, at least in part, either or both of the circuitry 225 and/or circuitry 210. In the alternative of FIG. 3, the local row circuitry 206 may be coupled to global row circuitry 210.

Figure 2:
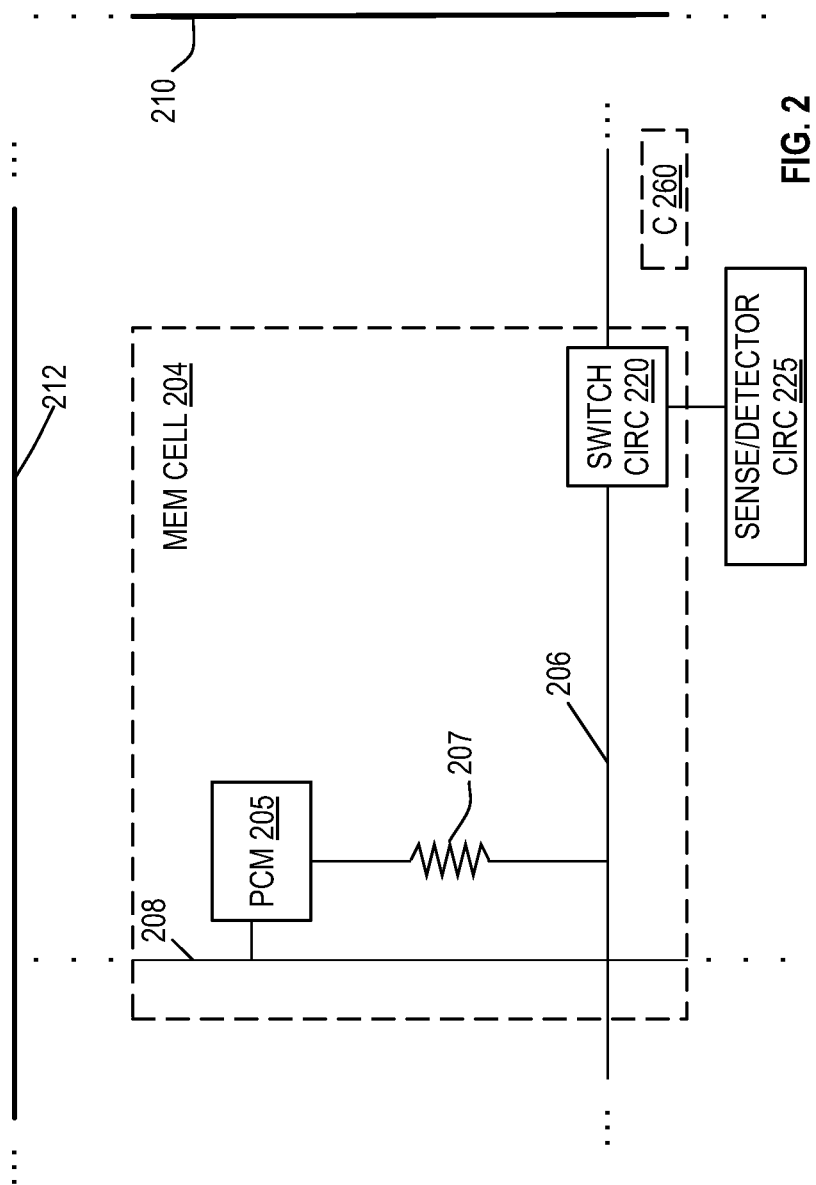
FIG. 2 illustrates features in an embodiment.

With particular reference now being made to FIGS. 2 and 4, operations 400 (see FIG. 4) that may be carried out and/or involved in an embodiment to read from cell 204 at least one datum that may be stored in PCM 205 and/or cell 204 will be described. The operations 400 described herein may be implemented by and/or as a result of, at least in part, control and/or other signals generated and/or supplied, at least in part, by circuitry 103. Initially (e.g., prior to and/or contemporaneous with the commencement of operations 400), switch circuitry 220 may couple sense circuitry 225 and global row circuitry 210 to local row circuitry 206. Operations 400 may commence with the selecting of cell 204 for the read operation (see operation 402). In this embodiment, operation 402 may comprise the enabling of the decode paths associated with the local row circuitry 206 and local column circuitry 208 of cell 204. Thereafter, local row circuitry 206 may undergo a read-related pre-charging that may result in a voltage differential being generated (see operation 404) between the local row circuitry 206 and the local column circuitry 208.

This voltage differential may be such that the voltage amplitude Vpc of the local row circuitry 206 relative to the local column circuitry 208 may be less than a predetermined threshold voltage Vt (i.e., Vpc<Vt). This threshold voltage Vt may be a detection bias voltage that is sufficient to permit the memory cell 204 to be read during a read of memory cell 204 (e.g., that is sufficient to permit the resistance properties of the PCM 205 to be sensed, measured, and/or detected) while being below the minimum voltage differential that would result in resistor 207 heating PCM 205 to a degree that would result in a phase change that would change the logic state previously written into the PCM 205.

After operation 404 has been carried out, as part of operation 406, switch circuitry 220 may de-couple, at least in part, local row circuitry 206 from one or more remaining portions (e.g., other than local row circuitry 206) of memory device 102, such as, for example, global row circuitry 210 and/or sense and detector circuitry 225. This may result in local row circuitry 206 becoming and/or being electrically isolated from, at least in part, and/or floating (e.g., in terms of voltage) relative to global row circuitry 210 and/or detector circuitry 225. Also as part of operation 406, the voltage driver circuitry of circuitry 103 may be de-coupled and/or electrically isolated, at least in part, from global row circuitry 210 and/or sense and detector circuitry 225. As a result, at least in part, of operation 406, local row circuitry 206 may become and/or be isolated, at least in part, from electrical capacitance (C, and/or other electrical properties and/or characteristics) 260 of and/or associated with global row circuitry 210 and/or sense and detector circuitry 225.

After operation 406 has been carried out, and while local row circuitry 206 is contemporaneously electrically isolated, at least in part, from capacitance 260, global row circuitry 210, and/or sense and detector circuitry 225, the voltage bias of local column circuitry 208 may be increased (e.g., ramped) until the voltage differential Vt is established between the local row circuitry 206 and the local column circuitry 208. Thus, in this embodiment, the voltage differential Vt is established between local row circuitry 206 and local column circuitry 208, during, at least in part, the time when local row circuitry 206 is electrically isolated, at least in part, from capacitance 260, global row circuitry 210, and/or sense and detector circuitry 225.

Subsequent to the establishing (as part of operation 408) of the voltage differential Vt between local row circuitry 206 and local column circuitry 208, switch circuitry 220 may re-couple (as part of operation 410) the global row circuitry 210 and/or sense and detector circuitry 225 to the local row circuitry 206. After such re-coupling has been carried out, and while local row circuitry 206 is coupled to the global row circuitry 210 and the sense and detector circuitry 225, a read of the at least one datum that was previously written to memory cell 204 and/or PCM 205 may be performed, as illustrated by operation 412. This read may be accomplished, at least in part, by circuitry 225 and/or circuitry 103 determining, at least in part, one or more resistive properties and/or characteristics of the PCM 205 that may be reflected in and/or derivable via, at least in part, the voltage and/or current that may be detected by circuitry 225.

For example, if the PCM 205 and/or cell 204 have a set (e.g., 0 logic) state prior to the commencement of operations 400, then the PCM 205 and/or cell 204 may be in a relatively high resistance state (e.g., relative to a relatively low resistance state). However, the establishing of the voltage differential Vt in operation 408, while the local row circuitry 206 is isolated, at least in part, from the global row circuitry 210 and/or sense circuitry 225, may be sufficient to result in PCM 205 and/or cell 204 transitioning to the relatively low resistance state. This may result, at least in part, in local row circuitry 206 charging sufficiently to approach the bias voltage of the local column circuitry 208.

Thereafter, however, prior to the performing of operation 410, the voltage differential between the local row circuitry 206 and the local column circuitry 208 may reduce to below the snap-back holding voltage of the PCM 205 and/or cell 204. Thus, voltage-snap back of the cell 204 and/or PCM 205 may occur while and/or during the time when the local row circuitry 206 is de-coupled (and therefore isolated), at least in part, from the global row circuitry 210 and/or circuitry 225. This may result, at least in part, in the PCM 205 and/or cell 204 returning to the relatively high resistance state.

With the PCM 205 and/or cell 204 again in the relatively high resistance state, operation 410 may be performed. The cell 204 and/or PCM 205 may then be read (as part of operation 412) while the PCM 205 and/or cell 204 are in the relatively high resistance state and while the global row circuitry 210 and the sense circuitry 225 are coupled to the local row circuitry 206. As a consequence, the charge sharing among the local row circuitry 206, the global row circuitry 210, and the sense circuitry 225 may result in current flow and/or voltage shift being detected by the sense circuitry 225 and/or circuitry 103 that may be indicative of the high resistance state that corresponds to the set state.

Conversely, if the PCM 205 and/or cell 204 have a reset (e.g., 1 logic) state prior to the commencement of operations 400, then the establishing of the voltage differential Vt in operation 408, while the local row circuitry 206 is isolated, at least in part, from the global row circuitry 210 and/or sense circuitry 225, may not be sufficient to result in transitioning of the resistance state of the PCM 205 and/or cell 204 (e.g., from relatively high to relatively low). Accordingly, the local row circuitry 206 may remain at the pre-charge voltage Vpc, and when the cell 204 and/or PCM 205 are read as part of operation 412, the local row circuitry 206, the global row circuitry 210, and the sense circuitry 225 may all be at or near equipotential. Accordingly, during operation 412, relatively little or no current flow and/or voltage shift may be detected. This may indicate that the cell 204 and/or PCM 205 are in the reset state.

Alternatively, if memory cell 204 has the construction illustrated in FIG. 3, then the above operations 400 may be carried out as follows. Initially (e.g., prior to and/or contemporaneous with the commencement of operations 400), switch circuitry 220 may couple sense circuitry 225 and global column circuitry 212 to local column circuitry 208. Operations 400 may commence with the selecting of cell 204 for the read operation (see operation 402). In this embodiment, operation 402 may comprise the enabling of the decode paths associated with the local column circuitry 208 and local row circuitry 206 of cell 204. Thereafter, local column circuitry 208 may undergo a read-related pre-charging that may result in a voltage differential being generated (see operation 404) between the local column circuitry 208 and the local column circuitry 206. This pre-charge voltage differential may have the amplitude Vpc.

After operation 404 has been carried out, as part of operation 406, switch circuitry 220 may de-couple, at least in part, local column circuitry 208 from one or more remaining portions (e.g., other than local column circuitry 208) of memory device 102, such as, for example, global column circuitry 212 and/or sense and detector circuitry 225. This may result in local column circuitry 208 becoming and/or being electrically isolated from, at least in part, and/or floating (e.g., in terms of voltage) relative to global column circuitry 212 and/or detector circuitry 225. Also as part of operation 406, the voltage driver circuitry of circuitry 103 may be de-coupled and/or electrically isolated, at least in part, from global column circuitry 212 and/or sense and detector circuitry 225. As a result, at least in part, of operation 406, local column circuitry 208 may become and/or be isolated, at least in part, from electrical capacitance (C, and/or other electrical properties and/or characteristics) 270 of and/or associated with global column circuitry 212 and/or sense and detector circuitry 225.

After operation 406 has been carried out, and while local column circuitry 208 is contemporaneously electrically isolated, at least in part, from capacitance 270, global column circuitry 212, and/or sense and detector circuitry 225, the voltage bias of local row circuitry 206 may be increased (e.g., ramped) until the voltage differential Vt is established between the local column circuitry 208 and the local row circuitry 206. Thus, in this embodiment, the voltage differential Vt is established between local column circuitry 208 and local row circuitry 206, during, at least in part, the time when local column circuitry 208 is electrically isolated, at least in part, from capacitance 270, global column circuitry 212, and/or sense and detector circuitry 225.

Subsequent to the establishing (as part of operation 408) of the voltage differential Vt between local column circuitry 208 and local row circuitry 206, switch circuitry 220 may re-couple (as part of operation 410) the global column circuitry 212 and/or sense and detector circuitry 225 to the local column circuitry 208. After such re-coupling has been carried out, and while local column circuitry 208 is coupled to the global column circuitry 212 and the sense and detector circuitry 225, a read of the at least one datum that was previously written to memory cell 204 and/or PCM 205 may be performed, as illustrated by operation 412. This read may be accomplished, at least in part, by circuitry 225 and/or circuitry 103 determining, at least in part, one or more resistive properties and/or characteristics of the PCM 205 that may be reflected in and/or derivable via, at least in part, the voltage and/or current that may be detected by circuitry 225.

For example, if the PCM 205 and/or cell 204 have a set (e.g., 0 logic) state prior to the commencement of operations 400, then the PCM 205 and/or cell 204 may be in a relatively high resistance state (e.g., relative to a relatively low resistance state). However, the establishing of the voltage differential Vt in operation 408, while the local column circuitry 208 is isolated, at least in part, from the global column circuitry 212 and/or sense circuitry 225, may be sufficient to result in PCM 205 and/or cell 204 transitioning to the relatively low resistance state. This may result, at least in part, in local column circuitry 208 charging sufficiently to approach the bias voltage of the local row circuitry 206.

Thereafter, however, prior to the performing of operation 410, the voltage differential between the local column circuitry 208 and the local row circuitry 206 may reduce to below the snap-back holding voltage of the PCM 205 and/or cell 204. Thus, voltage-snap back of the cell 204 and/or PCM 205 may occur while and/or during the time when the local column circuitry 208 is de-coupled (and therefore isolated), at least in part, from the global column circuitry 212 and/or circuitry 225. This may result, at least in part, in the PCM 205 and/or cell 204 returning to the relatively high resistance state.

With the PCM 205 and/or cell 204 again in the relatively high resistance state, operation 410 may be performed. The cell 204 and/or PCM 205 may then be read (as part of operation 412) while the PCM 205 and/or cell 204 are in the relatively high resistance state and while the global column circuitry 212 and the sense circuitry 225 are coupled to the local column circuitry 208. As a consequence, the charge sharing among the local column circuitry 208, the global column circuitry 212, and the sense circuitry 225 may result in current flow and/or voltage shift being detected by the sense circuitry 225 and/or circuitry 103 that may be indicative of the high resistance state that corresponds to the set state.

Conversely, if the PCM 205 and/or cell 204 have a reset (e.g., 1 logic) state prior to the commencement of operations 400, then the establishing of the voltage differential Vt in operation 408, while the local column circuitry 208 is isolated, at least in part, from the global column circuitry 212 and/or sense circuitry 225, may not be sufficient to result in transitioning of the resistance state of the PCM 205 and/or cell 204 (e.g., from relatively high to relatively low). Accordingly, the local column circuitry 208 may remain at the pre-charge voltage Vpc, and when the cell 204 and/or PCM 205 are read as part of operation 412, the local column circuitry 208, the global column circuitry 212, and the sense circuitry 225 may all be at or near equipotential. Accordingly, during operation 412, relatively little or no current flow and/or voltage shift may be detected. This may indicate that the cell 204 and/or PCM 205 are in the reset state.

Thus, an embodiment may comprise local row circuitry 206 that may be local to a memory cell 204 of a memory device 102, and local column circuitry 208 that may be local to the memory cell 204. In this embodiment, the local row circuitry 206 or the local column circuitry 208 may be made to become electrically isolated, at least in part, from at least one remaining portion (e.g., sense circuitry 225, and global row circuitry 210 or global column circuitry 212) of the memory device 102 during, at least in part, the establishing of a voltage differential Vt between the local row circuitry 206 and the local column circuitry 208 that is to permit the memory cell 204 to be read during a read of the memory cell 204. The read may occur subsequent to the establishing of the voltage differential Vt.

Advantageously, in this embodiment, either the local row circuitry or the local column circuitry may be isolated from (e.g., the capacitance of) the global row circuitry or global column circuitry (and/or additional circuitry), respectively, during a voltage-snap back of the cell and/or during the establishing of the voltage differential Vt prior to reading the cell. Advantageously, in this embodiment, this may reduce the amount of capacitive discharge that may occur during the read of the cell. Advantageously, in this embodiment, this may reduce the degree to which the cell's logic state may be disturbed during such read operations, and/or increase the number of read operations that may be performable on the cell before the cell's data should be rewritten. Further advantageously, in this embodiment, this may permit the memory's performance to be improved without substantially increasing the complexity of the operations and/or circuitry involved in managing the memory.

Other modifications are also possible. For example, memory cells and/or memory devices in accordance with one or more embodiments may be used and/or comprised in one or more devices such as one or more multi-layered and/or integrated PCM cell arrays, and/or one or more phase change memory and switch (PCMS) arrangements (e.g., in which one or more PCM elements may be combined with one or more Ovonic threshold switches). Additionally or alternatively, one or more such devices may be used to advantage to replace dynamic random access memory and/or other types of memory devices for use in (e.g., host) system memory, solid state memory, flash memory, and/or portable computing devices (e.g., personal data assistants, smart phones, cell phones, laptops, netbooks, and/or other devices). Accordingly, this embodiment should be viewed broadly as encompassing all such alternatives, modifications, and variations.

What is claimed is:

1. An apparatus comprising:
local row circuitry that is local to a memory cell of a memory device;
local column circuitry that is local to the memory cell;
wherein one of the local row circuitry and the local column circuitry is to be electrically isolated, at least in part, from at least one remaining portion of the memory device during, at least in part, establishing of a voltage differential between the local row circuitry and the local column circuitry that is to permit the memory cell to be read during a read of the memory cell, the read to occur subsequent to the establishing of the voltage differential;
also wherein:
if the one of the local row circuitry and the local column circuitry is the local row circuitry:
the at least one remaining portion of the memory device comprises global row circuitry and decode circuitry of the memory device; and
during the read of the memory cell, the local row circuitry is to be electrically coupled to the global row circuitry and the decode circuitry; and
if the one of the local row circuitry and the local column circuitry is the local column circuitry:
the at least one remaining portion of the memory device comprises global column circuitry and the decode circuitry of the memory device; and
during the read of the memory cell, the local column circuitry is to be electrically coupled to the global column circuitry and the decode circuitry.

2. The apparatus of 1, wherein:
the memory device is comprised in a removable memory device that is capable of being removably coupled to a host via an interface of the host.

3. The apparatus of claim 1, wherein:
the memory device is a non-volatile memory device.

4. An apparatus comprising:
local row circuitry that is local to a memory cell of a memory device;
local column circuitry that is local to the memory cell;
wherein one of the local row circuitry and the local column circuitry is to be electrically isolated, at least in part, from at least one remaining portion of the memory device during, at least in part, establishing of a voltage differential between the local row circuitry and the local column circuitry that is to permit the memory cell to be read during a read of the memory cell, the read to occur subsequent to the establishing of the voltage differential;
also wherein:
prior to electrically isolating, at least in part, the one of the local row circuitry and the local column circuitry from the at least one remaining portion of the memory device, the one of the local row circuitry and local column circuitry is to have a voltage amplitude relative to the other of the local row circuitry and the local column circuitry that is less than the voltage differential; and
contemporaneous with the establishing of the voltage differential, the one of the local row circuitry and the local column circuitry is to be electrically isolated, at least in part, from the at least one remaining portion such that the one of the local row circuitry and the local column circuitry is electrically isolated, at least in part, from capacitance of the at least one remaining portion.

5. An apparatus comprising:
local row circuitry that is local to a memory cell of a memory device;
local column circuitry that is local to the memory cell;
wherein one of the local row circuitry and the local column circuitry is to be electrically isolated, at least in part, from at least one remaining portion of the memory device during, at least in part, establishing of a voltage differential between the local row circuitry and the local column circuitry that is to permit the memory cell to be read during a read of the memory cell, the read to occur subsequent to the establishing of the voltage differential;
also wherein:
the memory cell is a phase change memory cell;
if the memory cell is in a set state:
prior to the establishing of the voltage differential, the memory cell is to be in a relatively high resistance state relative to a relatively low resistance state;
after the establishing of the voltage differential, the memory cell is to enter the relatively low resistance state, and thereafter, the memory cell is to return to the relatively high resistance state; and
during the read, the memory cell is to be in the relatively high resistance state while the at least one remaining portion is electrically coupled to the at least one remaining portion.

6. The apparatus of claim 5, wherein:
during a voltage snap-back of the memory cell, the one of the local row circuitry and the local column circuitry is to be electrically de-coupled at least in part from the at least one remaining portion.

7. The apparatus of claim 5, wherein:
if the memory cell is in a reset state:
prior to the establishing of the voltage differential, the memory cell is to be in the relatively high resistance state; and
after the establishing of the voltage differential, the memory cell is to remain in the relatively high resistance state.

8. A method comprising:
electrically isolating, at least in part, one of local row circuitry and low column circuitry from at least one remaining portion of a memory device during, at least in part, establishing of a voltage differential between the local row circuitry and the local column circuitry, the local row circuitry and the local column circuitry being local to a memory cell of the memory device, the voltage differential being to permit the memory cell to be read during a read of the memory cell, the read to occur subsequent to the establishing of the voltage differential;
also wherein:
if the one of the local row circuitry and the local column circuitry is the local row circuitry:
the at least one remaining portion of the memory device comprises global row circuitry and decode circuitry of the memory device; and
during the read of the memory cell, the local row circuitry is to be electrically coupled to the global row circuitry and the decode circuitry; and
if the one of the local row circuitry and the local column circuitry is the local column circuitry:
the at least one remaining portion of the memory device comprises global column circuitry and the decode circuitry of the memory device; and during the read of the memory cell, the local column circuitry is to be electrically coupled to the global column circuitry and the decode circuitry.

9. The method of claim 8, wherein:
prior to the electrically isolating, at least in part, of the one of the local row circuitry and the local column circuitry from the at least one remaining portion of the memory device, the one of the local row circuitry and local column circuitry is to have a voltage amplitude relative to the other of the local row circuitry and the local column circuitry that is less than the voltage differential; and
contemporaneous with the establishing of the voltage differential, the one of the local row circuitry and the local column circuitry is to be electrically isolated, at least in part, from the at least one remaining portion such that the one of the local row circuitry and the local column circuitry is electrically isolated, at least in part, from capacitance of the at least one remaining portion.

10. The method of claim 8, wherein:
the memory cell is a phase change memory cell;
if the memory cell is in a set state:
prior to the establishing of the voltage differential, the memory cell is to be in a relatively high resistance state relative to a relatively low resistance state;
after the establishing of the voltage differential, the memory cell is to enter the relatively low resistance state, and thereafter, the memory cell is to return to the relatively high resistance state; and
during the read, the memory cell is to be in the relatively high resistance state while the at least one remaining portion is electrically coupled to the at least one remaining portion.

11. The method of claim 10, wherein:
during a voltage snap-back of the memory cell, the one of the local row circuitry and the local column circuitry is to be electrically de-coupled at least in part from the at least one remaining portion.

12. The method of claim 10, wherein:
if the memory cell is in a reset state:
prior to the establishing of the voltage differential, the memory cell is to be in the relatively high resistance state; and
after the establishing of the voltage differential, the memory cell is to remain in the relatively high resistance state.

13. The method of 8, wherein:
the memory device is comprised in a removable memory device that is capable of being removably coupled to a host via an interface of the host.

14. An apparatus comprising:
local row circuitry that is local to a memory cell of a memory device;
local column circuitry that is local to the memory cell;
global row circuitry, global column circuitry, and sense circuitry of the memory device;
wherein one of the local row circuitry and the local column circuitry is to be electrically isolated, at least in part, from one of first circuitry and second circuitry during, at least in part, establishing of a voltage differential between the local row circuitry and the local column circuitry that is to permit the memory cell to be read during a read of the memory cell, the read to occur subsequent to the establishing of the voltage differential, the first circuitry comprising the global row circuitry and sense circuitry, the second circuitry comprising the global column circuitry and the sense circuitry;
also wherein:
the memory cell is a phase change memory cell;
if the memory cell is in a set state:
prior to the establishing of the voltage differential, the memory cell is to be in a relatively high resistance state relative to a relatively low resistance state;
after the establishing of the voltage differential, the memory cell is to enter the relatively low resistance state, and thereafter, the memory cell is to return to the relatively high resistance state; and
during the read, the memory cell is to be in the relatively high resistance state while the at least one remaining portion is electrically coupled to the at least one remaining portion.

15. The apparatus of claim 14, wherein:
during a voltage snap-back of the memory cell, the one of the local row circuitry and the local column circuitry is to be electrically de-coupled at least in part from the at least one remaining portion.

16. The apparatus of 14, wherein:
the memory device comprises a cross-point memory that is comprised in a removable memory device that is capable of being removably coupled to a host via an interface of the host.

17. An apparatus comprising:
local row circuitry that is local to a memory cell of a memory device;
local column circuitry that is local to the memory cell;
global row circuitry, global column circuitry, and sense circuitry of the memory device;
wherein one of the local row circuitry and the local column circuitry is to be electrically isolated, at least in part, from one of first circuitry and second circuitry during, at least in part, establishing of a voltage differential between the local row circuitry and the local column circuitry that is to permit the memory cell to be read during a read of the memory cell, the read to occur subsequent to the establishing of the voltage differential, the first circuitry comprising the global row circuitry and sense circuitry, the second circuitry comprising the global column circuitry and the sense circuitry;
also wherein:
if the memory cell is in a reset state:
prior to the establishing of the voltage differential, the memory cell is to be in the relatively high resistance state; and
after the establishing of the voltage differential, the memory cell is to remain in the relatively high resistance state.

* * * * *